(12) United States Patent
Bocan et al.

(10) Patent No.: US 11,160,177 B2
(45) Date of Patent: Oct. 26, 2021

(54) ELECTRONIC CONTROL UNIT FOR A VEHICLE, IN PARTICULAR COMMERCIAL VEHICLE

(71) Applicant: WABCO EUROPE BVBA, Brussels (BE)

(72) Inventors: Pawel Bocan, Wroclaw (PL); Dominik Szczerba, Domaslaw (PL); Michal Wolanski, Wroclaw (PL)

(73) Assignee: WABCO EUROPE BVBA, Brussels (BE)

( * ) Notice: Subject to any disclaimer, the term of this patent is extended or adjusted under 35 U.S.C. 154(b) by 0 days.

(21) Appl. No.: 16/340,967

(22) PCT Filed: Sep. 11, 2017

(86) PCT No.: PCT/EP2017/001070
§ 371 (c)(1),
(2) Date: Apr. 10, 2019

(87) PCT Pub. No.: WO2018/068878
PCT Pub. Date: Apr. 19, 2018

(65) Prior Publication Data
US 2019/0306999 A1 Oct. 3, 2019

(30) Foreign Application Priority Data
Oct. 10, 2016 (EP) .................................. 2016002179

(51) Int. Cl.
*H05K 5/00* (2006.01)
*B60T 8/36* (2006.01)
*B60R 16/023* (2006.01)

(52) U.S. Cl.
CPC .......... *H05K 5/0073* (2013.01); *B60T 8/3685* (2013.01); *B60R 16/0239* (2013.01)

(58) Field of Classification Search
CPC .. H05K 5/0073; B60T 8/3685; B60R 16/0239
See application file for complete search history.

(56) References Cited

U.S. PATENT DOCUMENTS 5,460,342 A * 10/1995 Dore .................... B60R 16/0215
248/68.1
7,727,030 B2 * 6/2010 Christoph .......... H01R 13/6275
439/676

(Continued)

FOREIGN PATENT DOCUMENTS

DE 19647203 A1 5/1998
DE 20215282 U1 12/2003

(Continued)

OTHER PUBLICATIONS

International Search Report for International Application No. PCT/EP2017/001070 dated Nov. 28, 2017, 4 pages.

(Continued)

*Primary Examiner* — Hung S. Bui
*Assistant Examiner* — Sagar Shrestha
(74) *Attorney, Agent, or Firm* — Warner Norcross + Judd LLP (57) ABSTRACT

An electronic control unit for controlling a vehicle part is provided herein. The electronic control unit comprises a housing. The housing has an exterior surface and mounting elements on the exterior surface. The mounting elements are adapted for fastening the housing to a structure of a vehicle.

18 Claims, 4 Drawing Sheets

(56) References Cited

U.S. PATENT DOCUMENTS

| | | | | |
|---|---|---|---|---|
| 2007/0241256 | A1* | 10/2007 | Stigler | B60R 11/00 248/423 |
| 2008/0008560 | A1* | 1/2008 | Wakabayashi | B60R 16/0215 411/510 |
| 2009/0090833 | A1* | 4/2009 | Daraz | B60R 11/0241 248/316.7 |
| 2014/0157557 | A1* | 6/2014 | Diep | F16L 3/1075 24/519 |
| 2014/0346798 | A1* | 11/2014 | Chou | B60R 16/0215 296/1.08 |
| 2017/0277020 | A1* | 9/2017 | Kasai | G03B 17/561 |
| 2018/0109044 | A1* | 4/2018 | Kawamura | H01R 13/506 |
| 2018/0310421 | A1* | 10/2018 | Kato | H05K 5/0204 |
| 2019/0225169 | A1* | 7/2019 | Leancu | H02G 3/32 |
| 2019/0275953 | A1* | 9/2019 | Mori | B60R 16/0239 |
| 2019/0312383 | A1* | 10/2019 | Watanabe | H01R 13/6273 |
| 2019/0322223 | A1* | 10/2019 | Hancock | B60R 11/00 |

FOREIGN PATENT DOCUMENTS

| | | |
|---|---|---|
| DE | 102006023471 A1 | 11/2007 |
| DE | 102007012189 B3 | 9/2008 |
| EP | 2878494 A1 | 6/2015 |
| FR | 2821898 A1 | 9/2002 |
| FR | 3029063 A1 | 5/2016 |
| GB | 2164894 A | 4/1986 |
| WO | 2014036087 A1 | 3/2014 |

OTHER PUBLICATIONS

Machine assisted English translation of DE19647203A1 obtained from https://worldwide.espacenet.com on Apr. 9, 2019, 11 pages.
Machine assisted English translation of DE20215282U1 obtained from https://worldwide.espacenet.com on Apr. 9, 2019, 21 pages.
Machine assisted English translation of DE102007012189B3 obtained from https://worldwide.espacenet.com on Apr. 9, 2019, 18 pages.
Machine assisted English translation of EP2878494A1 obtained from https://worldwide.espacenet.com on Apr. 9, 2019, 17 pages.
Machine assisted English translation of FR3029063A1 obtained from https://patents.google.com on Apr. 9, 2019, 5 pages.
Machine assisted English translation of FR2821898A1 obtained from https://worldwide.espacenet.com/ on Jan. 21, 2021, 6 pages.

\* cited by examiner

ELECTRONIC CONTROL UNIT FOR A VEHICLE, IN PARTICULAR COMMERCIAL VEHICLE

CROSS-REFERENCE TO RELATED APPLICATIONS

This application is a national phase entry of PCT/EP2017/001070, filed Sep. 11, 2017, which claims priority to European Patent Application No. 2016002179, filed Oct. 10, 2016, both of which are incorporated herein by reference in their entirety.

FIELD OF THE DISCLOSURE

The present disclosure relates to an electronic control unit for controlling a vehicle part, such as a pneumatic or hydraulic system of a vehicle, such as commercial vehicle, comprising a housing, the housing having an exterior surface and mounting elements on the exterior surface, wherein the mounting elements are adapted for fastening the housing to a structure of the vehicle. The disclosure further relates to a vehicle, such as a commercial vehicle and the use of a housing in such vehicle.

BACKGROUND

Electronic control units of the aforementioned types are generally known in the art. Electronic control units are in particular used in commercial vehicles such as trucks or buses to control braking systems such as anti-lock braking systems (ABS), electronic brake systems (EBS) or chassis or wheel suspension-related systems such as electronic controlled air suspension systems (ECAS). The electronic control units mentioned above contain a number of electronic parts, e.g. processors and the like which are placed in housings to protect the circuitry from external influences such as dirt, fluids etc. The electronic control unit has to be installed in a suitable location in the vehicle, for example on a structure of a vehicle trailer or in the vicinity of the engine of the vehicle. In order to fasten the generally box-shaped housing of the electronic control unit to the structure of the vehicle, mounting elements are required. In the prior art, one common mounting element has been a metal spring member which can elastically be deformed to accommodate different types of mounting solutions.

The fixation of the spring element to the housing of the electronic control unit has in the past been done by riveting. While performing the holding function satisfactorily, the process of riveting has been considered worthy of improvement because of the time and costs involved. In certain extreme situations, damage to the housing and loss of the protective functions of the housing can theoretically occur.

Accordingly, it has been an object of the disclosure to suggest an improved electronic control unit which alleviates the aforementioned problems as much as possible. In particular, it has been an object of the disclosure to provide an improved electronic control unit, vehicle and/or use of housing which allows for easier installation of the electronic control unit to a structure of a vehicle.

BRIEF SUMMARY

An electronic control unit for controlling a vehicle part is provided herein. The electronic control unit comprises a housing. The housing has an exterior surface and mounting elements on the exterior surface. The mounting elements are adapted for fastening the housing to a structure of the vehicle. The mounting elements comprise a clamp. The clamp is integrally formed on the exterior surface of the housing.

BRIEF DESCRIPTION OF THE DRAWING

The invention is described in greater detail below with reference to the accompanying figures, in which.

DETAILED DESCRIPTION

With reference to the specific embodiment of the figures, wherein like numerals generally indicate like parts throughout the several views, an electronic control unit is provided herein. In certain embodiments, mounting elements comprise a clamp, the clamp being integrally formed. In various embodiments, the clamp is molded, on an exterior surface of a housing. The disclosure may be based upon the realization that molding a clamp to the exterior of the housing can be done simultaneously when manufacturing the housing itself, thus saving a number of manufacturing steps. The clamp on the exterior surface of the housing allows for a flexible attachment of further fixation elements to the housing. These further fixation elements merely require one member which is compatible with being inserted into the clamp. This allows for very flexible outfitting of the housing of the electronic control unit with various different fixation members, which can be metal springs, but can also be other members for various mounting requirements.

In one embodiment, the clamp comprises a first jaw, a second jaw, wherein the first and second jaws are elastically pivotable with respect to one another, and a clamping gap in-between the first and second jaws. The gap may define an insertion plane which represents the direction in which articles can be moved into and out of the gap. The insertion plane may extend substantially equidistantly between the first and second jaws.

In another embodiment, the first and second jaws are integrally formed, and may be molded, to one another. In an exemplary embodiment, the first and second jaws and the housing are integrally made from the same material in a molding process, creating a homogenous material behavior under load.

In yet another embodiment, the first and second jaws have mutually facing clamping surfaces, and at least one of the clamping surfaces, in certain embodiments, each of the clamping surfaces, may comprises a number of alternating protrusions and recesses. Herein, the protrusions respectively extend from their associated jaw towards the respective other jaw. The effective gap width from one jaw to the other may therefore be defined by the distance of the protrusions to one another across the insertion plane, i.e. in a direction transverse to the insertion plane.

In another embodiment, the protrusions are convexly shaped, and the recesses are concavely shaped. The protrusions and recesses may merge into one another. In this context, the protrusions may be recesses that merge seamlessly into one another. Herein, seamlessly is understood to mean essentially kink-free, meaning that the surface extending across the protrusions and recesses extends unbroken, in in certain embodiments tangential and of constant curvature from a protrusion to a recess and vice-versa. This layout facilitates insertion of an article into the clamp because sharp edges may be prevented.

In yet another embodiment, the protrusions of one jaw are positioned directly opposite of a recess of the respective other jaw, such that the gap between the first and second jaws is substantially wave-shaped. This wave-shaped layout may have one key benefit: When manufacturing the clamp, such as when molding the clamp, the gap is defined during manufacturing by placing a molding insert in the position where the gap is to be formed. Molding inserts for defining gaps have the negative shape of the gap. In the present case, the gap is comparatively long and narrow meaning that a correspondingly long and narrow molding insert may have to be used. These inserts may be fragile. The wave-shaped design, however, has the effect that the actual gap width meaning the shortest distance from one jaw to the opposite other jaw can be made larger than the required (effective) gap width for the clamping purposes. Since the actual gap in its wave-shape meanders along the clamp, and the effective gap width may be defined by the distances of the offset protrusions in a direction transverse to the insertion plane, the height and depth of the protrusions and recesses defines the actual gap width at least partially. In other words, the wave-shaped design allows for clamping thinner objects than would be possible with a straight line gap design, because the width of the gap would be limited by the technical feasibility of manufacturing a molding insert for the gap. With the wave-shaped design, a relatively thick molding insert can be used to manufacture a gap having a very thin effective gap width.

In another embodiment, the mounting elements further comprise an external fixation member. The external fixation member may comprise a clamping portion. The clamping portion may be adapted to be releasably held by the clamp. Basically, as mentioned hereinabove, any shape of external fixation member can be mounted to the electronic control unit with its clamp as long as the clamping portion of the external fixation member is compatible with the gap defined by the first and second jaws. Due to the elastic deformability of the jaws, a certain tolerance band of clamping portion thicknesses may be provided.

The clamping portion may be an essentially planar member which, when inserted into the clamp extends parallel, such as coplanar, to the insertion plane.

The clamping portion may be releasably held by the first and second jaws. In certain embodiments, the clamping portion is dimensioned so that upon inserting it between the first and second jaws, it is effective to elastically pivot the first and second jaws away from one another, creating a resilient force that causes the jaws to frictionally hold onto the clamping portion.

In another embodiment, the mounting elements comprise a snap-fit protrusion. The snap-fit protrusion may be positioned on the exterior surface. The snap-fit protrusion may be effective to at least partially obstruct the gap between the first and second jaws.

The snap-fit protrusion may have a wedged surface that is effective to be engaged by the clamping portion of the external fixation member during its introduction into the gap, such that the first or second jaw is elastically deformed to allow insertion of the clamping portion by sliding past the snap fit protrusion. In this embodiment, the snap-fit protrusion may remain stationary, i.e. undeformed, during insertion.

In yet another embodiment, the snap-fit protrusion is alternatively or additionally elastically deformable between a locking state and a release state; effective to clear the gap between the first and second jaws when in the release state; and effective to at least partially obstruct the gap between the first and second jaws when in the locking state, such as having a wedged surface that is effective to be engaged by the clamping portion of the external fixation member during its introduction into the gap such that the snap-fit protrusion is deformed into the release state. In this embodiment, the snap-fit protrusion is in other words configured to give way to the clamping portion of the external fixation member when inserting the external fixation member into the gap and to spring back from the release position into the locking position after the clamping portion has completely passed the snap-fit protrusion. Removal of the clamping portion of the external fixation member from the gap may require displacement of the snap-fit protrusion from the locking state into the release state.

Further, the snap-fit protrusion may be adapted to snap back into the locking state after full introduction of the clamping portion into the gap; and further may comprise a stop shoulder that is positioned adjacent the clamping portion after its full introduction into the gap, and may engage the clamping portion.

In another embodiment, the snap-fit protrusion is integrally formed, and may be molded, with the housing. Alternatively, the snap-fit protrusion is integrally formed, and may be molded, to the first or second jaw.

In yet another embodiment of the disclosure, the external fixation member is a spring element having at least one spring portion coupled with the clamping portion, and may be integrally formed with the clamping portion.

The disclosure has hereinabove been described according to a first aspect with reference to the electronic control unit itself.

A vehicle, such as a commercial vehicle, is also provided herein. The vehicle may have a part to-be-controlled, such as a pneumatic or hydraulic system, in certain embodiments a braking system, chassis or wheel suspension. The vehicle has a vehicle structure, and at least one electronic control unit for controlling the vehicle part, such as pneumatic or hydraulic system. The electronic control unit may be fixed to the vehicle structure. The electronic control unit may be formed in accordance with any one of the (or any combination of) the embodiments described hereinabove.

A use of a housing as housing of an electronic control unit in a vehicle, such as a commercial vehicle, for fixing the electronic control unit to a structure of the vehicle is also provided herein, The housing may have an exterior surface and mounting elements on the exterior surface. The mounting elements may be adapted for fastening the housing to the structure of the vehicle. The mounting elements may comprise a clamp, the clamp being integrally formed, and may be molded on the exterior surface of the housing.

The use in accordance with the disclosure may have the same advantages and embodiments as the aforementioned vehicle and as the aforementioned electronic control unit insofar as the housing of the electronic control unit is concerned. Consequently, the use according to the disclosure may be developed further according to any one of the (or any combination of) the embodiments described hereinabove with regard to the vehicle and the electronic control unit.

For a more complete understanding of the disclosure, the disclosure will now be described in more detail with reference to the accompanying drawings. The detailed description will illustrate and describe or is considered as an embodiment of the disclosure. It should of course be understood that various modifications and changes in form or detail could readily be made without departing from the scope of the disclosure. It is therefore intended that the disclosure may not be limited to the exact form and detail shown and described herein, nor to anything less than the whole of the disclosure disclosed herein and is claimed hereinafter.

Further, the features described in the description, the drawings and the claims disclosing the disclosure may be essential for the disclosure considered alone or in combination. In particular, any reference signs in the claims shall not be construed as limiting the scope of the disclosure. The word "comprising" does not exclude other elements or steps. The wording "a" or "an" does not exclude a plurality.

Figure 1:
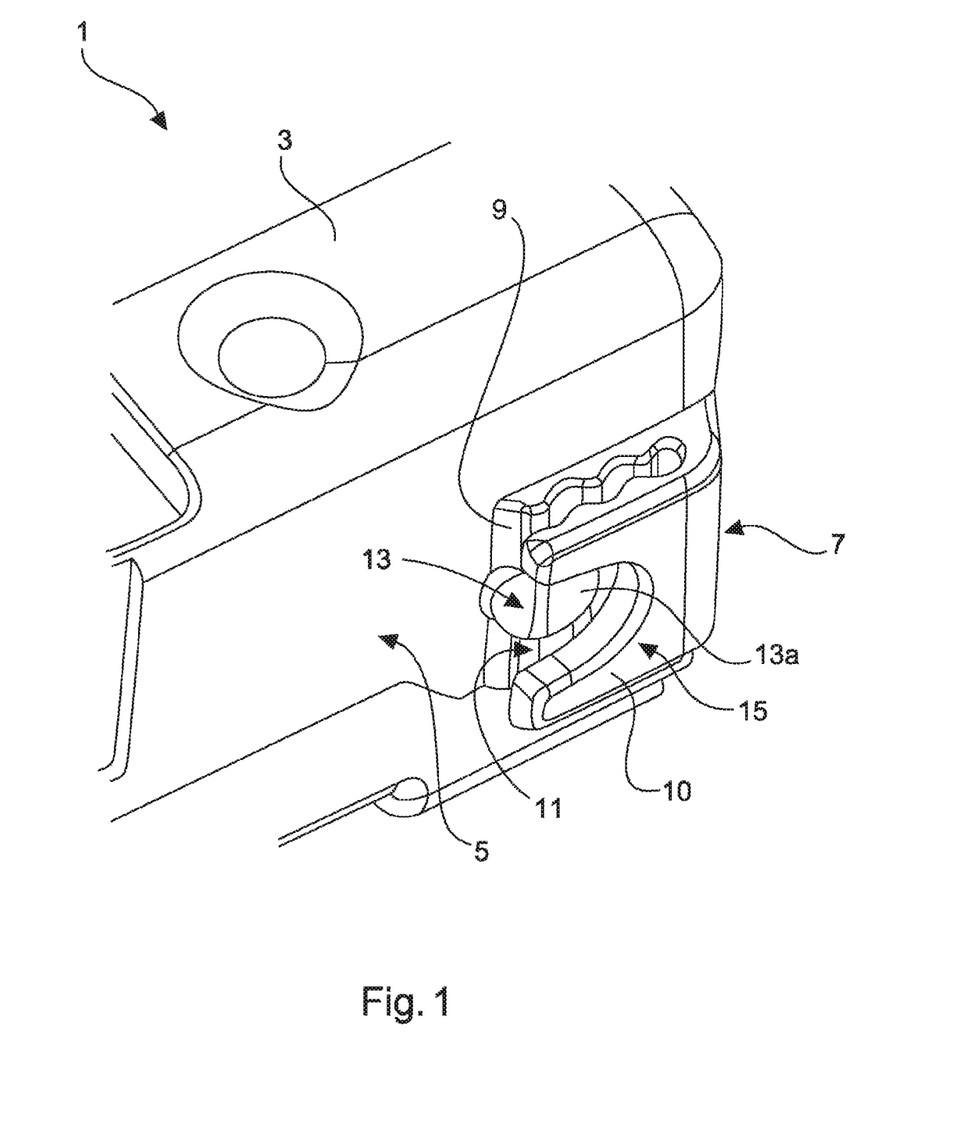
FIG. 1 shows an electronic control unit in a partial three-dimensional schematic view.

In FIG. 1, an electronic control unit 1 is shown. The electronic control unit 1 comprises a housing 3. The housing 3 has an exterior surface 5. A clamp 7 is integrally formed with the housing 3 on the exterior surface 5.

The clamp 7 may comprise a first jaw 9 and a second jaw 10. The first and second jaws 9,10 may be arranged parallel to and opposite of one another. In-between the first and second jaws 9,10, a gap 11 may be defined. On an introduction side of the gap 11, a snap-fit protrusion 13 may be arranged. The snap-fit protrusion 13 may comprise a wedged surface 13a which may be angled relative to the gap 11 such that upon insertion of an article into the gap 11, at least one of the first and second jaws 9,10, and in certain embodiments the second jaw 10, is elastically deformed to allow for insertion of the article by sliding past the snap-fit protrusion 13 which in itself is stationary. In certain embodiments, the snap-fit protrusion 13 may alternatively or additionally be elastically deformed to clear the width of the gap 11 and allow for an insertion of the article. After passing the snap-fit protrusion 13, the second jaw 10 and the snap-fit protrusion 13 may be in an interlocking relationship and prevent inadvertent removal of the article from the gap 11. In order to release any articles from the gap 11, either the previously deformed jaw (in certain embodiments the second jaw 11, or alternatively the snap-fit protrusion 13, see above) may have to be manually deformed to allow sliding passage of the article past the snap-fit protrusion 13. This can be achieved by deforming the second jaw 11 or, in the case of a deformable snap-fit protrusion 13, pushing an object through a (e.g. substantially finger-sized) recess 15 provided in the second jaw 10.

Figure 2:
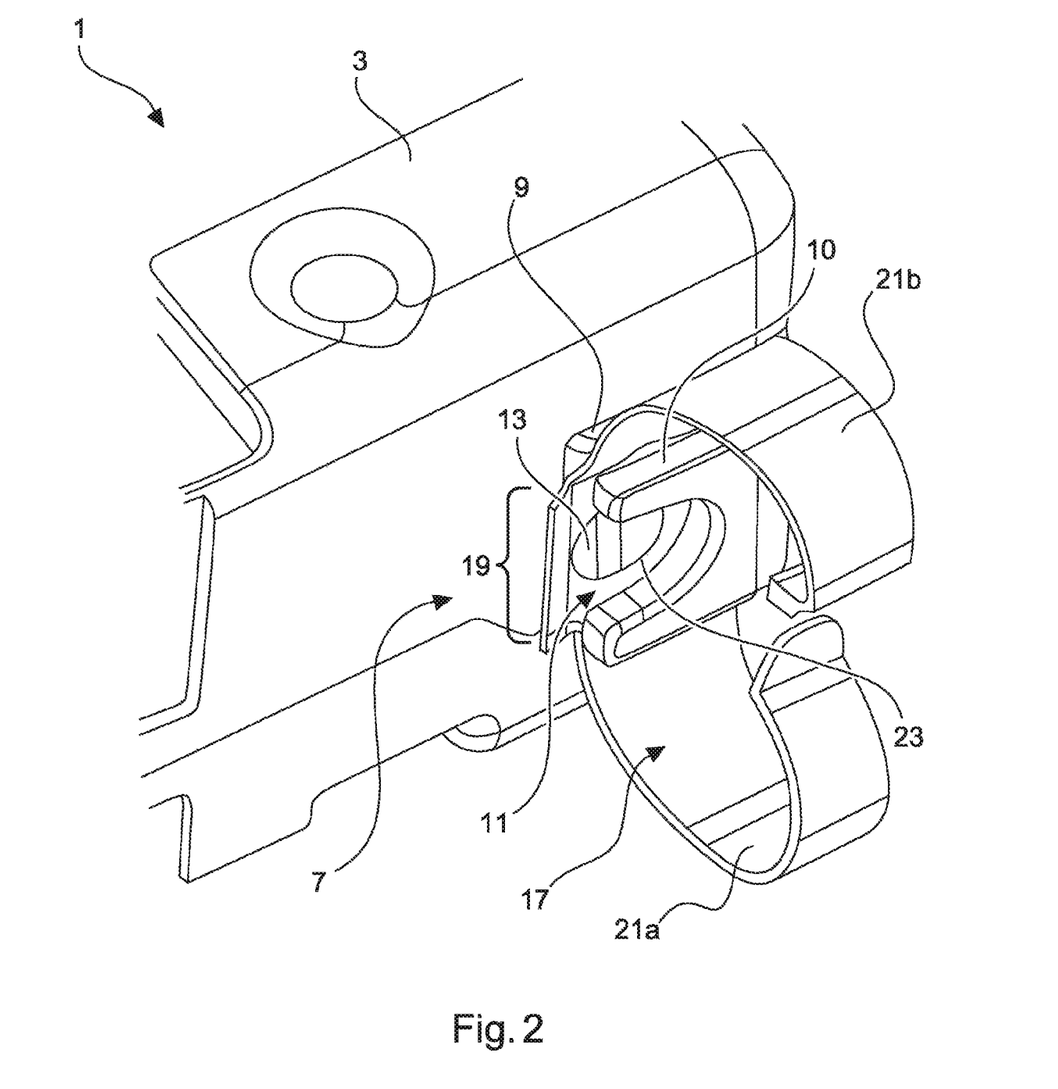
FIG. 2 shows the electronic control unit of FIG. 1 in a different mounting state.

FIG. 2 shows the electronic control unit 1 of FIG. 1 with an article in the form of an external fixation member 17 mounted to the housing 3. The external fixation member 17 shown in FIG. 2 is a metal spring member having a clamping portion 19 and oppositely located first and second spring portions 21a,b. The spring portions 21a,b and the clamping portion 19 may be integrally formed with each other, and seamlessly merge into one another. The clamping portion 19 may sit snugly inside the gap 11 and may be frictionally held in place by the first and second jaws 9, 10. The jaws 9,10 may have been slightly elastically pivoted away from one another during insertion of the clamping portion 19 into the gap 11, thus, in various embodiments, establishing a resilient force which attempts to pivot the second jaw 10 back towards the first jaw 9, leading to the holding of the clamping portion 19 within the gap 11 of clamp 7.

The external fixation member 17 may comprise a recess 23 which is shaped in correspondence with the snap-fit protrusion 13. The recess 23 may be positioned such that after full insertion of the clamping portion 19 into the gap 11, the second jaw 10 can be elastically pivoted by prying the second jaw 10 away from the first jaw 9, optionally additionally pushing through the recess 23 against the snap-fit protrusion 13 to increase leverage.

In embodiments where the snap-fit protrusion 13 is elastically deformable, the snap-fit protrusion 13 can snap into a locking state into the recess 23 after full insertion of the clamping portion 19 into the gap 11. The snap-fit protrusion 13 may comprise a stop shoulder 13b engaging the clamping portion 19 after full insertion.

Figure 3:
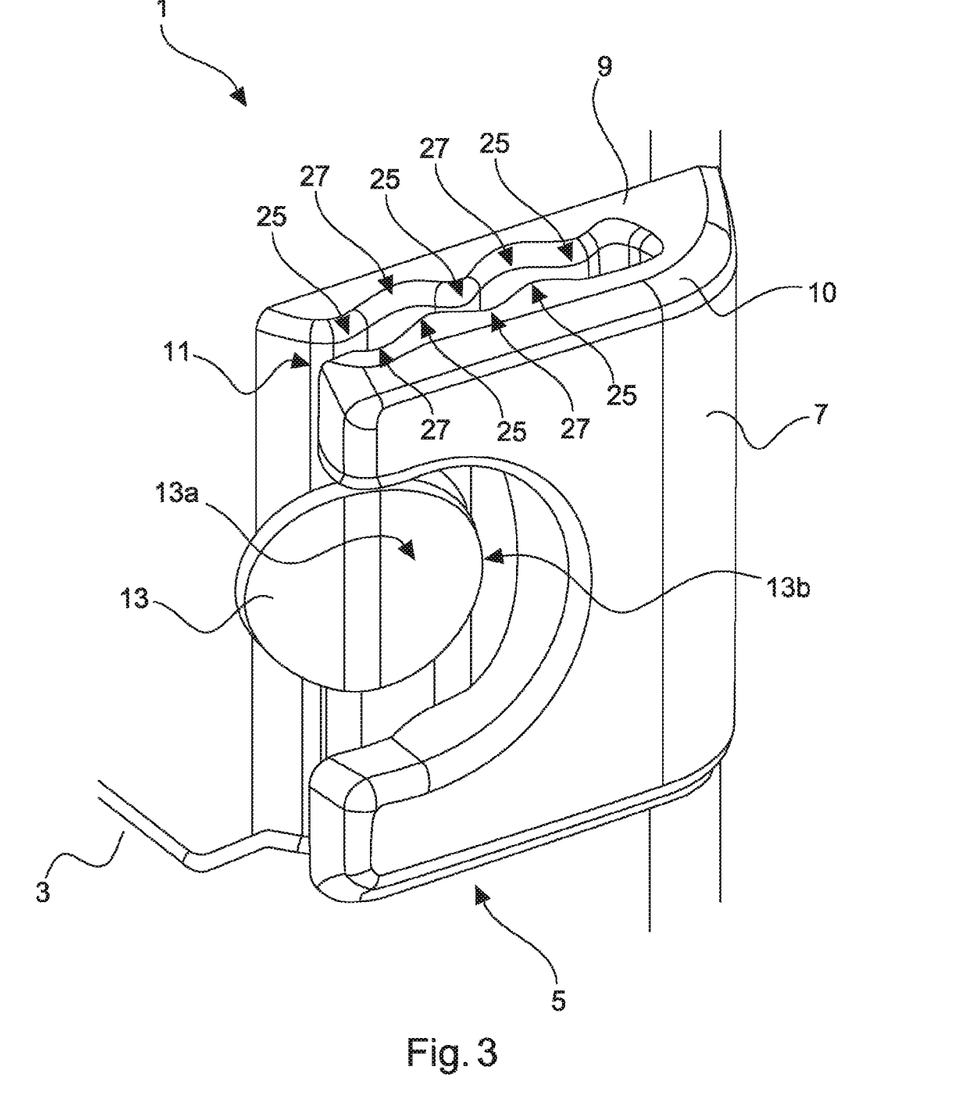
FIG. 3 shows an enlarged detail view to FIG. 1.

The clamp 7 of the housing 3 is shown in more detail in FIG. 3. As can be seen in FIG. 3, the first and second jaws 9,10 each comprise a series of alternating protrusions 25 and recesses 27. The protrusions 25 and recesses 27 are positioned in an offset alignment such that the protrusions 25 on the first jaw 9 are located directly opposite the recesses 27 of the second jaw 10 and vice versa. As a consequence thereof, the gap 11 in between the first and second jaws 9,10 may not extend in a straight line, but instead may be wave-shaped. This configuration is shown in more detail in FIG. 4. The jaws 9,10 and the gap 11 in-between the first and second jaws 9,10 may define an insertion plane P. Once inserted, the clamping portion 19 (FIG. 2) may be essentially coplanar with insertion plane P.

Figure 4:
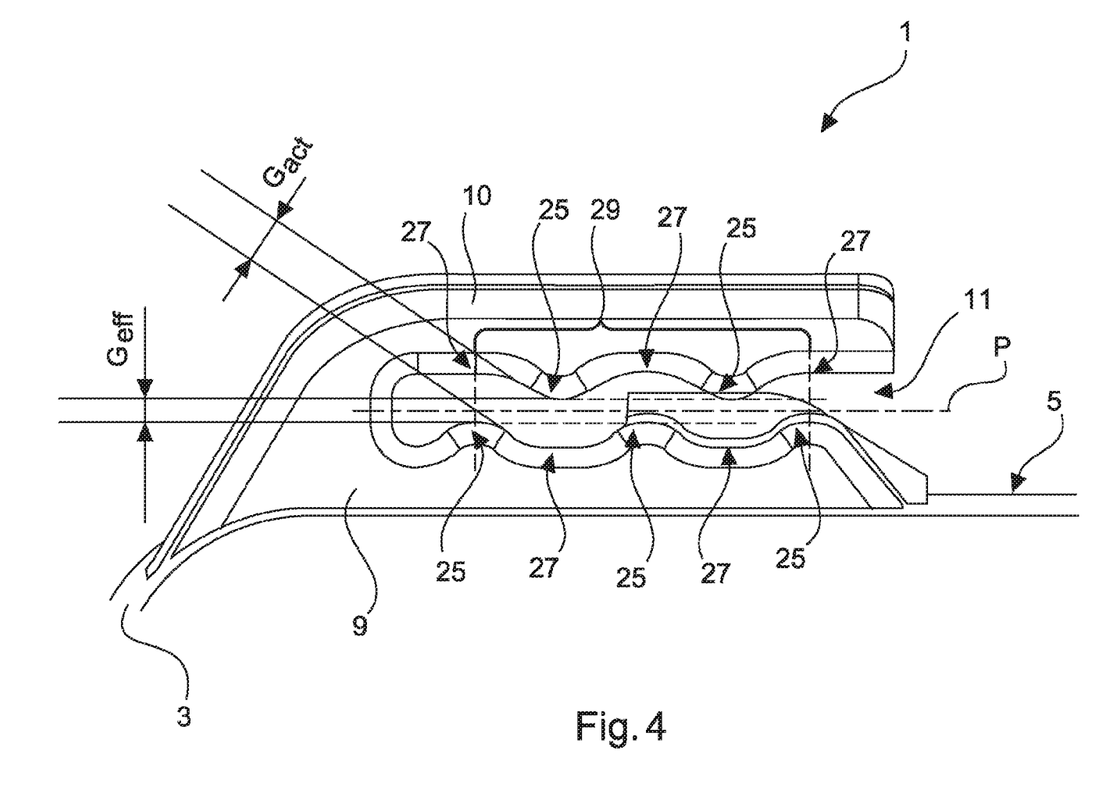
FIG. 4 shows a schematic partial side view to FIGS. 1 and 3.

The gap 11 has an effective gap width Geff which may be defined by the distances of the protrusions 25 to the insertion plane P in a direction transverse to the insertion plane P.

This effective gap width Geff may be smaller than the actual gap width Gact which is due to the meandering shape of the gap 11. Along a constant gap width section 29, the actual gap width Gact may be constant. This design allows for a comparatively sturdy manufacturing mold design having a sturdy molding insert for the gap 11, while at the same time having a very narrow effective gap width Geff which allows for clamping of very thin clamping portions 19 of external fixation members 17 (see FIG. 2).

As has been demonstrated, the disclosure suggests a comfortable-to-use and at the same time easy-to-manufacture housing with integrated fastening for external fixation members which allows for fast and easy installation of the electronic control unit 1 to basically any type of structure of a vehicle, be it frames, beams, cable trees, housing walls etc.

LIST OF REFERENCE SIGNS 1 electronic control unit
3 housing
5 exterior surface
7 clamp
9 first jaw
10 second jaw
11 gap
13 snap-fit protrusion
13a wedged surface
13b stop shoulder
15 recess in second jaw
17 external fixation member
19 clamping portion
21a,b spring portions
23 recess in clamping portion
25 protrusion
27 recess
29 constant gap width section
Gact actual gap width
Geff effective gap width
P insertion plane The terms "comprising" or "comprise" are used herein in their broadest sense to mean and encompass the notions of "including," "include," "consist(ing) essentially of," and "consist(ing) of. The use of "for example," "e.g.," "such as," and "including" to list illustrative examples does not limit to only the listed examples. Thus, "for example" or "such as" means "for example, but not limited to" or "such as, but not limited to" and encompasses other similar or equivalent examples. The term "about" as used herein serves to reasonably encompass or describe minor variations in numerical values measured by instrumental analysis or as a result of sample handling. Such minor variations may be in the order of ±0-25, ±0-10, ±0-5, or ±0-2.5, % of the numerical values. Further, The term "about" applies to both numerical values when associated with a range of values. Moreover, the term "about" may apply to numerical values even when not explicitly stated.

Generally, as used herein a hyphen "-" or dash "-" in a range of values is "to" or "through"; a ">" is "above" or "greater-than"; a "≥" is "at least" or "greater-than or equal to"; a "<" is "below" or "less-than"; and a "≤" is "at most" or "less-than or equal to." On an individual basis, each of the aforementioned applications for patent, patents, and/or patent application publications, is expressly incorporated herein by reference in its entirety in one or more non-limiting embodiments.

It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, it is to be appreciated that different, special, and/or unexpected results may be obtained from each member of the respective Markush group independent from all other Markush members. Each member of a Markush group may be relied upon individually and or in combination and provides adequate support for specific embodiments within the scope of the appended claims.

The present invention has been described herein in an illustrative manner, and it is to be understood that the terminology which has been used is intended to be in the nature of words of description rather than of limitation. Many modifications and variations of the present invention are possible in light of the above teachings. The present invention may be practiced otherwise than as specifically described within the scope of the appended claims. The subject matter of all combinations of independent and dependent claims, both single and multiple dependent, is herein expressly contemplated.

What is claimed is:

1. An electronic control unit for controlling a vehicle part, said electronic control unit comprising a housing, the housing having an exterior surface and mounting elements on the exterior surface, wherein the mounting elements are adapted for fastening the housing to a structure of the vehicle, wherein the mounting elements comprise a clamp, wherein the clamp is integrally formed on the exterior surface of the housing, the clamp comprising a first jaw and a second jaw, the first jaw being fixed with respect to the housing and the second jaw being elastically pivotable with respect to the first jaw such that an adjustable gap is defined between the first jaw and the second jaw, wherein the mounting elements further comprise a snap-fit protrusion positioned on the exterior surface of the housing and at least partially obstructing the adjustable gap between the first and second jaws.

2. The electronic control unit of claim 1, wherein the first and second jaws are integrally formed to one another.

3. The electronic control unit of claim 1, wherein the first and second jaws have mutually facing clamping surfaces, and at least one of the clamping surfaces comprises a number of alternating protrusions and recesses.

4. The electronic control unit of claim 3, wherein the protrusions are convexly shaped, and the recesses are concavely shaped.

5. The electronic control unit of claim 3, wherein the protrusions of one jaw are positioned directly opposite of a recess on the respective other jaw, such that the gap between the first and second jaws is substantially wave-shaped.

6. The electronic control unit of claim 1, wherein the mounting elements further comprise an external fixation member, wherein the external fixation member comprises a clamping portion, and wherein the clamping portion is adapted to be releasably held by the clamp.

7. The electronic control unit of claim 1, wherein the snap-fit protrusion has a wedged surface that is effective to be engaged by the clamping portion of the external fixation member during its introduction into the gap such that the first or second jaw is elastically deformed to allow insertion of the clamping portion by sliding past the snap fit protrusion.

8. The electronic control unit of claim 1, wherein the snap-fit protrusion is:
   elastically deformable between a locking state and a release state;
   effective to clear the gap between the first and second jaws when in the release state; and
   effective to at least partially obstruct the gap between the first and second jaws when in the locking state.

9. The electronic control unit of claim 8, wherein the snap-fit protrusion is adapted to snap back into locking state after full introduction of the clamping portion into the gap.

10. The electronic control unit of claim 1, wherein the snap-fit protrusion is integrally formed with the housing or one of the first and second jaws.

11. The electronic control unit of claim 6, wherein the external fixation member is a spring element having at least one spring portion coupled with the clamping portion.

12. A vehicle, comprising: a part to-be-controlled, a vehicle structure, and at least one electronic control unit for controlling the vehicle part, wherein the electronic control unit is fixed to the vehicle structure, and wherein the electronic control unit is formed in accordance with claim 1.

13. The electronic control unit of claim 1, wherein the vehicle part comprises a pneumatic or hydraulic system of a vehicle.

14. The electronic control unit of claim 4, wherein each of the clamping surfaces comprises a number of alternating protrusions and recesses, and wherein the protrusions and recesses merge into one another.

15. The electronic control unit of claim 8, wherein the snap-fit protrusion has a wedged surface that is effective to be engaged by the clamping portion of the external fixation member during its introduction into the gap such that the snap-fit protrusion is deformed into the release state.

16. The electronic control unit of claim 9, wherein the snap-fit protrusion further comprises a stop shoulder that is positioned adjacent the clamping portion after its full introduction into the gap, optionally engaging the clamping portion.

17. The electronic control unit of claim 10, wherein:
   the clamp is molded;
   the first and second jaws are molded;
   the snap-fit protrusion is molded; or
   combinations thereof.

18. The electronic control unit of claim 11, wherein the external fixation member is integrally formed with the clamping portion.

\* \* \* \* \*